United States Patent
Takahashi

(10) Patent No.: US 8,669,576 B2
(45) Date of Patent: Mar. 11, 2014

(54) SEMICONDUCTOR DEVICE AND METHOD OF MANUFACTURING THE SAME

(75) Inventor: Tsuyoshi Takahashi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 95 days.

(21) Appl. No.: 13/207,761

(22) Filed: Aug. 11, 2011

(65) Prior Publication Data

US 2012/0043587 A1 Feb. 23, 2012

(30) Foreign Application Priority Data

Aug. 19, 2010 (JP) ................... 2010-183616

(51) Int. Cl.
*H01L 33/00* (2010.01)
(52) U.S. Cl.
USPC .............................. 257/98; 257/101; 257/103
(58) Field of Classification Search
USPC ........................................... 257/98, 101, 103
See application file for complete search history.

(56) References Cited

U.S. PATENT DOCUMENTS

| | | | |
|---|---|---|---|
| 5,705,847 A | 1/1998 | Kashiwa | |
| 6,337,493 B1 * | 1/2002 | Tanizawa et al. | 257/79 |
| 6,635,907 B1 | 10/2003 | Nguyen | |

FOREIGN PATENT DOCUMENTS

| | | |
|---|---|---|
| JP | 9-331025 | 12/1997 |
| JP | 11-214676 | * 8/1999 |
| JP | 2000-114551 | 4/2000 |
| JP | 2003-518326 A1 | 6/2003 |

* cited by examiner

Primary Examiner — Tan N Tran
(74) Attorney, Agent, or Firm — Kratz, Quintos & Hanson, LLP

(57) ABSTRACT

A semiconductor device includes a first semiconductor layer of a first conductivity type, a second semiconductor layer formed in contact with the first semiconductor layer, and a third semiconductor layer of a second conductivity type formed in contact with the second semiconductor layer, the first semiconductor layer provided with a first semiconductor region at a given distance from an interface between the first semiconductor layer and the second semiconductor layer, and an impurity concentration of the first semiconductor region higher than an impurity concentration of the first semiconductor layer except where the first semiconductor region is formed.

12 Claims, 24 Drawing Sheets

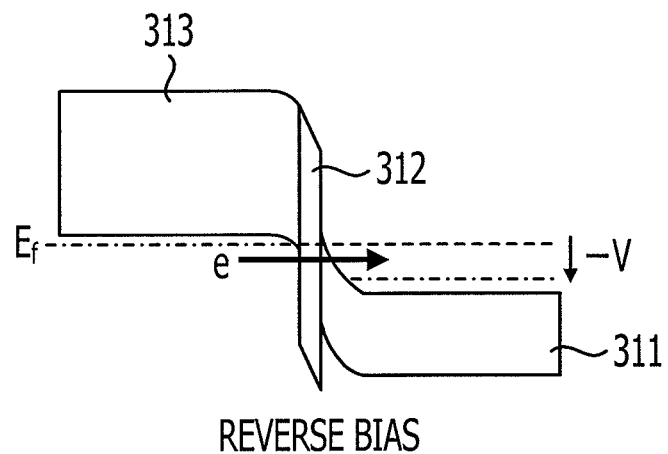
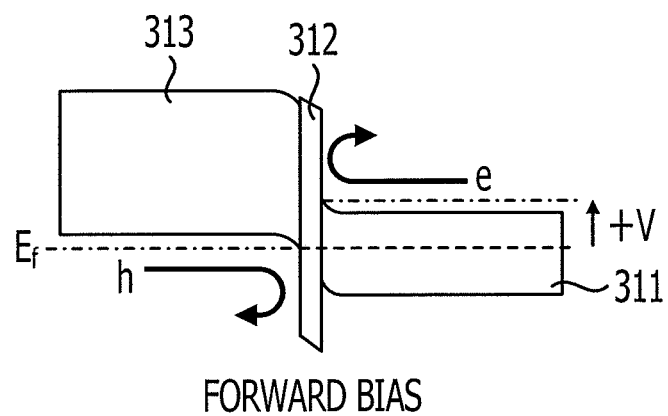

US 8,669,576 B2

SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application No. 2010-183616, filed on Aug. 19, 2010, the entire contents of which are incorporated herein by reference.

FIELD

The embodiments discussed herein relate to a semiconductor device and a method of manufacturing the semiconductor device.

BACKGROUND

Monolithic microwave integrated circuits (MMICs) that include low-noise amplifiers (LNAs) and detectors have been used for detecting weak millimeter waves. FIG. 1 is a circuit diagram of an MMIC 300 that includes an LNA and a detector. As illustrated in FIG. 1, millimeter waves that are received by an antenna 301 are amplified by an LNA 302 and are converted to direct current (DC) voltages by a detector 303. The DC voltages are output from an output terminal 304 as voltage $V_{det}$.

The detection sensitivity of millimeter waves by the MMIC 300 is affected significantly by the detector 303. Although Schottky-type diodes are typically used for the detector 303, it has been difficult to obtain adequate detection performance when the bias is approximately 0 V.

A backward diode, which is a type of a tunnel diode, is capable of high-frequency detection and mixing.

Japanese Patent Laid-open No. 2000-114551, Japanese Patent Laid-open No. 09-331025, and Japanese National Publication of International Patent Application No. 2003-518326 are examples of related art documents.

SUMMARY

According to an aspect of an embodiment, a semiconductor device includes a first semiconductor layer of a first conductivity type, a second semiconductor layer formed in contact with the first semiconductor layer, and a third semiconductor layer of a second conductivity type formed in contact with the second semiconductor layer, the first semiconductor layer provided with a first semiconductor region at a given distance from an interface between the first semiconductor layer and the second semiconductor layer, and an impurity concentration of the first semiconductor region higher than an impurity concentration of the first semiconductor layer except where the first semiconductor region is formed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4A and 4B are energy band diagrams of the backward diode when voltage is applied;
FIGS. 14A to 143 are sectional views of a backward diode according to the fourth embodiment.

DESCRIPTION OF EMBODIMENTS

To improve the performance of monolithic microwave integrated circuits (MMICs), replacing detectors that include a Schottky diode with detectors that include a backward diode has been considered. The backward diode generally includes a heterojunction and is characterized by band junction conditions.

Specifically, the backward diode includes a type-II heterojunction in which the energy of a conduction band of an n-type semiconductor layer is lower than the energy of a conduction band of a p-type semiconductor layer, and the energy of a valence band of the n-type semiconductor layer is lower than the energy of a valence band of the p-type semiconductor layer under flat-band conditions. Also, the energy of the conduction band of the n-type semiconductor layer is higher than the energy of the valence band of the p-type semiconductor layer.

Figure 1:
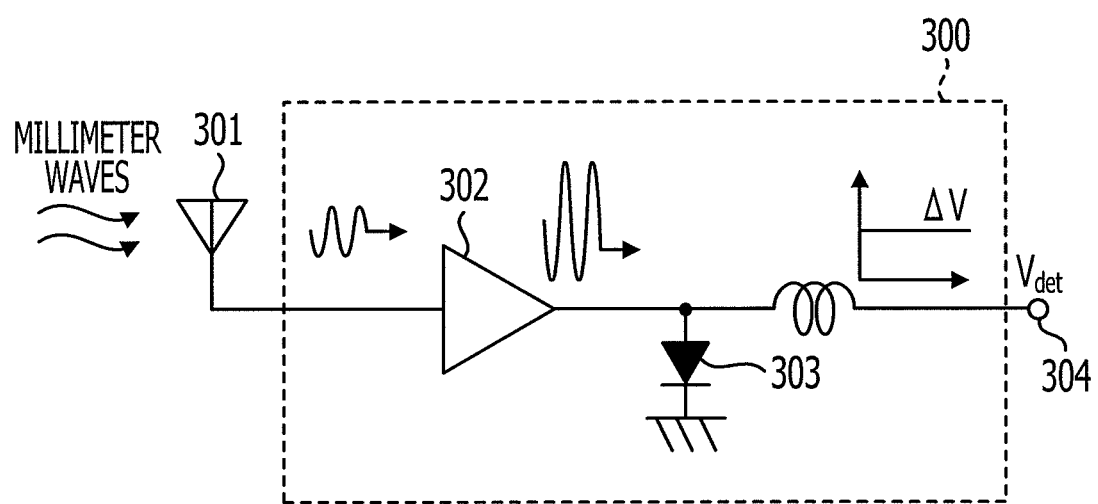
FIG. 1 is a circuit diagram of a monolithic microwave integrated circuit (MMIC)
Figure 2:
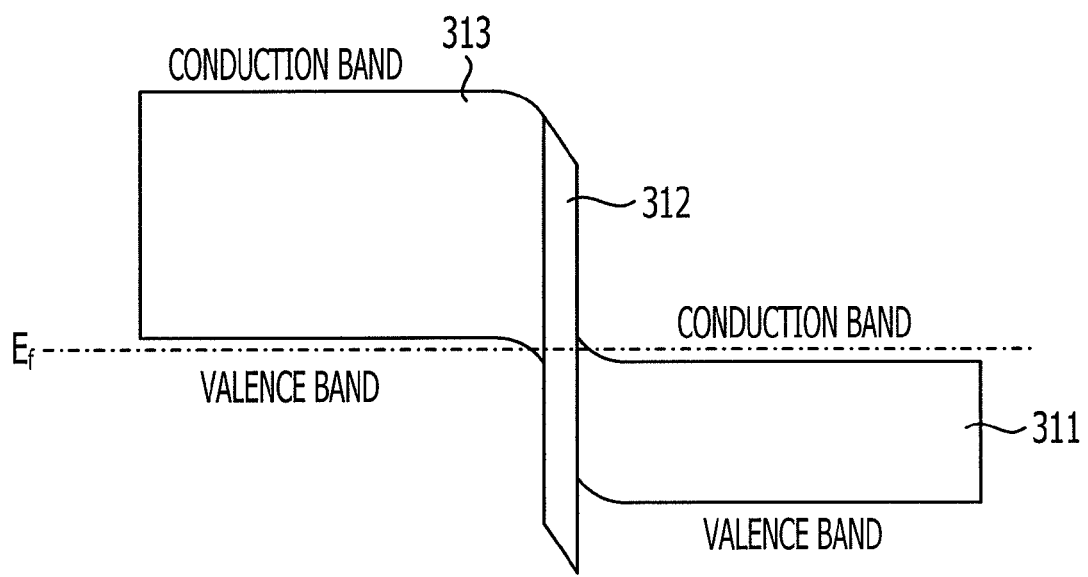
FIG. 2 is an energy band diagram of a backward diode.

FIG. 2 is an energy band diagram of the backward diode in which, for example, an $n^+$-InGaAs layer 311 as the n-type semiconductor layer, an InAlAs layer 312, which is non-doped, and a $p^+$-GaAsSb layer 313 as the p-type semiconductor layer are stacked. The InAlAs layer 312, which is non-doped, serves as a barrier layer and the band gap of the InAlAs layer 312 is larger than the band gap of the $n^+$-InGaAs layer 311 or the $p^+$-GaAsSb layer 313. Either the p-type semiconductor layer or the n-type semiconductor layer is formed to have a higher doping concentration and the doping concentration is increased so that the p-type semiconductor layer or the n-type semiconductor layer may be degenerated. The $n^+$-InGaAs layer 311, which is the n-type semiconductor layer, and the $p^+$-GaAsSb layer 313, which is the p-type semiconductor layer of the backward diode illustrated in FIG. 2, are doped with impurity elements in high concentration that yield an n-type or a p-type property. The energy level of the upper end of a valence band of the $p^+$-GaAsSb layer 313 and the lower end of a conduction band of the $n^+$-InGaAs layer 311 in the backward diode are substantially equal under an equilibrium condition. A dashed-dotted line $E_f$ in FIG. 2 indicates the Fermi level.

Figure 3:
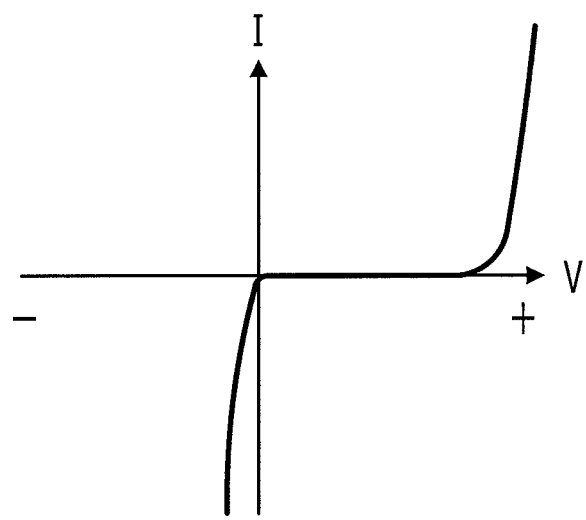
FIG. 3 illustrates voltage versus current characteristics of the backward diode.

FIG. 3 illustrates a relationship between current and voltage that is applied to the backward diode in FIG. 2, which has an energy band structure. As illustrated in FIG. 3, when voltage is applied to the backward diode in a reverse direction, as illustrated in FIG. 4A, electrons flow as a tunneling current from the valence band of the $p^+$-GaAsSb layer 313 to the conduction band of the $n^+$-InGaAs layer 311 because voltage is applied in a negative direction. As illustrated in FIG. 4B, when voltage is applied to the backward diode in a forward direction, the $n^+$-InGaAs layer 311 becomes a barrier against holes and the $p^+$-GaAsSb layer 313 becomes a barrier against electrons, and the current hardly flows until a given voltage is applied, since voltage is applied in a positive direction. Thus, the backward diode is characterized by high nonlinearity in the vicinity of 0 V.

Figure 5A:
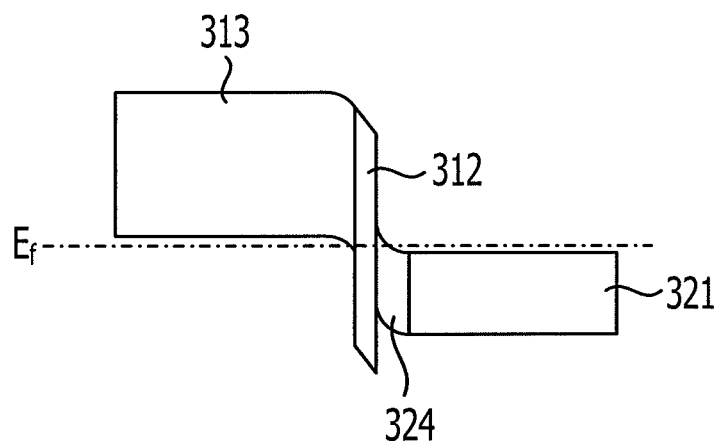
FIGS. 5A and 5B are energy band diagrams of another structure of the backward diode.

To improve the detection performance of the backward diode, several methods may be considered. For example, as illustrated in FIG. 5A, the backward diode may be provided with an $n^+$-InGaAs layer 324, which is doped with impurity elements in high concentration. The $n^+$-InGaAs layer 324 may be provided between the InAlAs layer 312 and an n-InGaAs layer 321. Thus, by providing the backward diode with the $n^+$-InGaAs layer 324, a conduction band of the $n^+$-InGaAs layer 324 may be bent more sharply and a depletion layer may be formed narrower. As a result, the width of a forbidden band decreases in terms of Fermi level and the tunneling current may flow more easily. The concentration of doped impurity elements are, for example, $1\times10^{18}$ cm$^{-3}$ in the n-InGaAs layer 321 and $8\times10^{18}$ cm$^{-3}$ in the $n^+$-InGaAs layer 324. The thickness of the $n^+$-InGaAs layer 324 is preferably formed to be approximately equal to the thickness of the depletion layer.

Figure 5B:
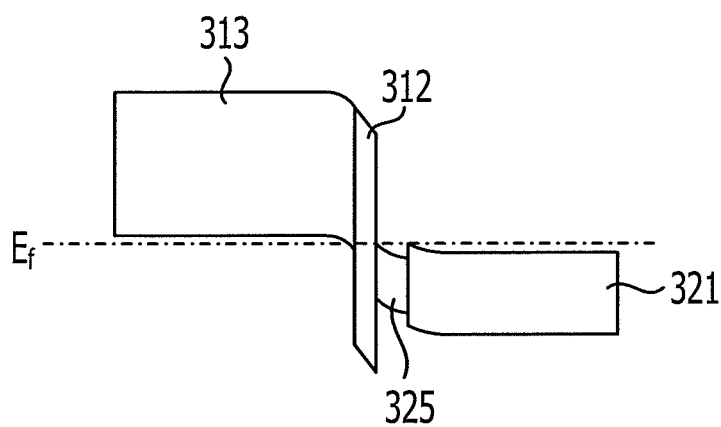

As illustrated in FIG. 5B, a band adjustment layer 325 with a smaller band gap than the band gap of the n-InGaAs layer 321, may be provided between the InAlAs layer 312 and the n-InGaAs layer 321 of the backward diode as an alternative method. The energy level of the lower end of a conduction band of the band adjustment layer 325 is lower than the lower end of a conduction band of the n-InGaAs layer 321. For example, when $In_{0.53}Ga_{0.47}As$ is used in the n-InGaAs layer 321, $In_xGa_{1-x}As$ (x>0.53) with a smaller band gap than the band gap of the n-InGaAs layer 321 is used in the band adjustment layer 325. Thus, the tunneling current may flow more easily since the conduction band of the band adjustment layer 325 decreases without the conduction band of the band adjustment layer 325 being bent sharply. It is preferable for the value of x of the $In_xGa_{1-x}As$ to be approximately in the range of 0.53<x<0.7 and for the thickness of the band adjustment layer 325 to be approximately 10 nm because the critical film thickness of the $In_xGa_{1-x}As$ decreases when the value of x increases.

Figure 6A:
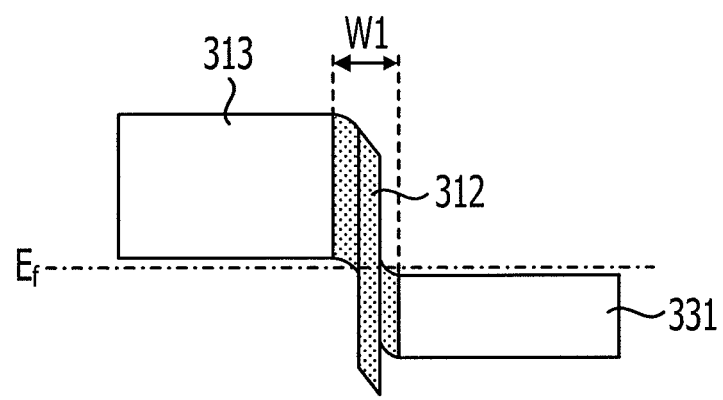
FIGS. 6A and 6B illustrate the backward diode of still another structure.
Figure 6B:
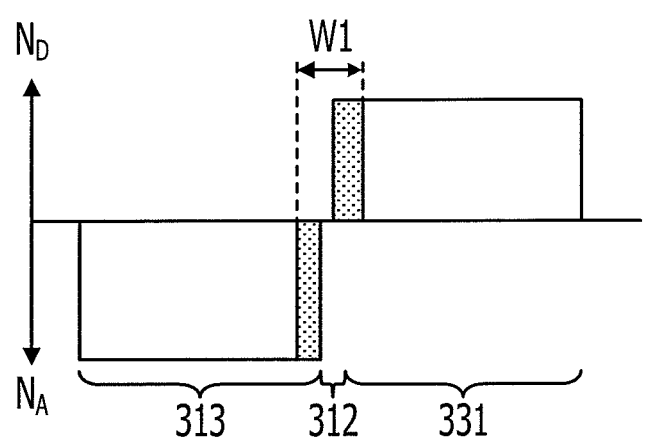

As illustrated in FIGS. 6A and 6B, when an $n^+$-InGaAs layer 331 is formed with impurity elements in high concentration, in the range of $5\times10^{18}$ cm$^{-3}$ and $1\times10^{19}$ cm$^{-3}$, the junction capacitance of a pn junction increases because a width W1 of the depletion layer decreases. FIG. 6A is an energy band diagram of the backward diode and FIG. 6B is a diagram illustrating the concentration of impurity elements that are doped to become a donor or an acceptor. $N_D$ indicates an impurity element that serves as the donor and $N_A$ indicates an impurity element that serves as the acceptor.

Thus, the structure of the backward diode is preferably formed so that the backward diode is capable of high frequency detection and the tunneling current may flow more easily. In other words, it is preferable for the structure of a semiconductor device and a method of manufacturing the semiconductor device to be capable of high frequency detection and the tunneling current to flow more easily.

Embodiments of the semiconductor device and the method of manufacturing the semiconductor device are described below. The same reference numerals are given to the same elements and the description is omitted.

The first embodiment is described below. A relationship between the cutoff frequency and the junction capacitance of a pn junction is expressed in Equation 1. In Equation 1, $f_c$ is the cutoff frequency, $R_s$ is the contact resistance and the resistance inside a semiconductor device, and $C_j$ is the junction capacitance of the pn junction.

$$f_c = \frac{1}{2\pi R_s C_j} \qquad \text{Equation 1}$$

As expressed in Equation 1, as the junction capacitance $C_j$ increases, the cutoff frequency $f_c$ decreases. Thus, for the semiconductor device to detect higher frequencies, in other words, to increase the cutoff frequency $f_c$, reducing the junction capacitance $C_j$ of the pn junction is desirable.

Figure 7A:
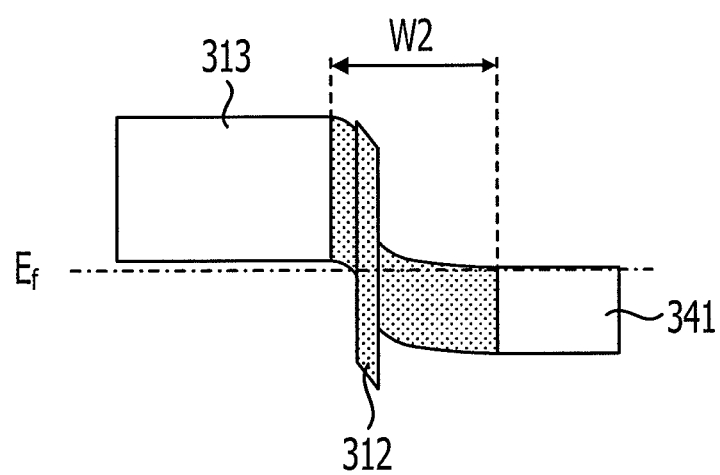
FIGS. 7A and 7B illustrate another structure of the backward diode.
Figure 7B:
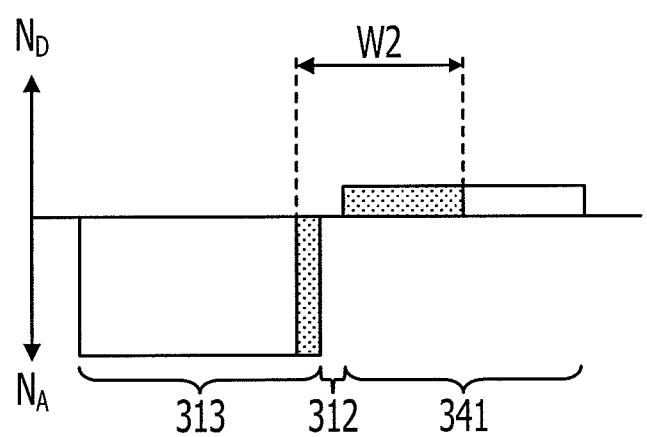

As illustrated in FIGS. 7A and 7B, a backward diode that includes an n-InGaAs layer 341, which is formed with impurity elements in low concentration, ranging from $1\times10^{17}$ cm$^{-3}$ to $5\times10^{18}$ cm$^{-3}$, may be used to reduce the junction capacitance $C_j$ of the pn junction. However, a conduction band energy $E_c$ of the n-InGaAs layer 341 increases although a width W2 of the depletion layer increases and the junction capacitance q may be reduced in the backward diode. As a result, the probability of an inter-band tunneling is significantly reduced and the detection sensitivity decreases. FIG. 7A is an energy band diagram of the backward diode and FIG. 7B illustrates the concentration of doped impurity elements that serve as a donor or an acceptor.

Figure 8:
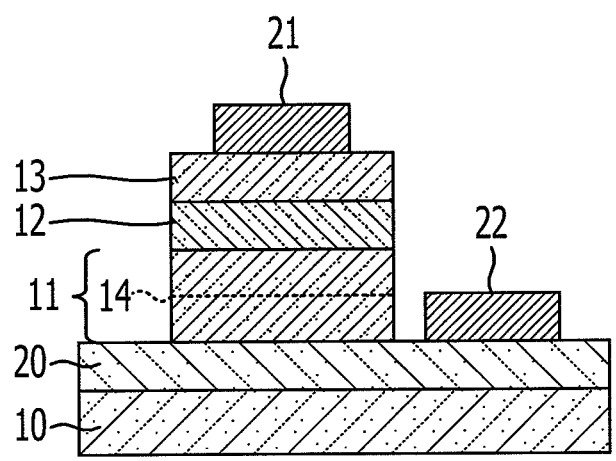
FIG. 8 is a sectional view of a backward diode according to the first embodiment.

FIG. 8 illustrates the structure of the backward diode according to the first embodiment. The backward diode is provided with an n-InGaAs layer 11, an InAlAs layer 12, which is non-doped, and a $p^+$-GaAsSb layer 13 stacked over an InP substrate 10 via a buffer layer (not illustrated) and an $n^+$-InGaAs contact layer 20. The band gap of the InAlAs layer 12 is larger than the band gap of the n-InGaAs layer 11 or the $p^+$-GaAsSb layer 13. The n-InGaAs layer 11 is the first semiconductor layer, the InAlAs layer 12 is the second semiconductor layer, and the $p^+$-GaAsSb layer 13 is the third semiconductor layer.

Figure 9A:
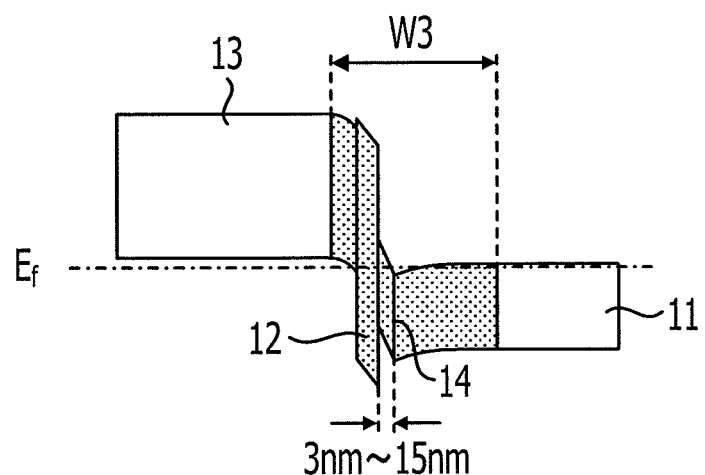
FIGS. 9A and 9B illustrate the backward diode according to the first embodiment.
Figure 9B:
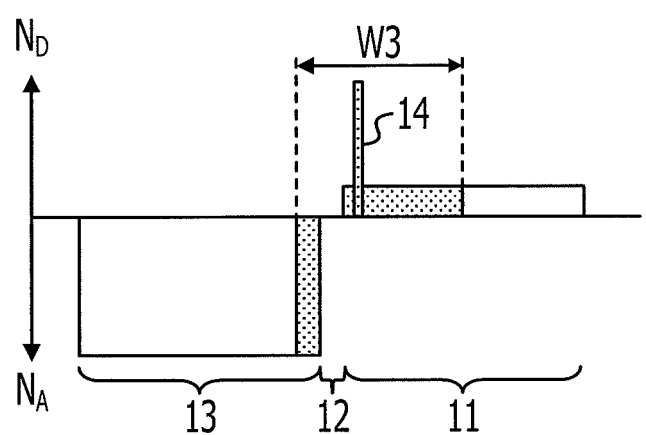

Also, a high concentration region 14 that is planar-doped with Si as the impurity element is formed in the n-InGaAs layer 11 at a distance of 3 nm to 15 nm from an interface between the InAlAs layer 12 and the n-InGaAs layer 11. The $n^+$-InGaAs contact layer 20 is doped with impurities in high concentration and is conductive. An electrode 21, which is a diode electrode, is formed over the $p^+$-GaAsSb layer 13, and an electrode 22, which is another diode electrode, is formed over the $n^+$-InGaAs contact layer 20. The n-InGaAs layer 11 is doped with impurity elements in low concentration and the $p^+$-GaAsSb layer 13 is doped with impurity elements in high concentration. FIG. 9A is an energy band diagram of the backward diode according to the first embodiment and FIG. 9B illustrates the concentration of impurity elements that are doped to be the donor or the acceptor.

The high concentration region 14 is formed at a distance of 3 nm to 15 nm from the interface between the InAlAs layer 12 and the n-InGaAs layer 11 of the backward diode. As a result, the tunneling current may flow more easily because the conduction band energy in the high concentration region 14 decreases. Since the high concentration region 14 is formed in a considerably narrow region, a width W3 of the depletion layer is formed to be large, the junction capacitance decreases, and the cutoff frequency may be increased. Thus, the detectable frequency of the backward diode may be increased without reducing the tunneling current.

As mentioned above, the high concentration region 14 is preferably formed in the n-InGaAs layer 11 at a distance of 3 nm to 15 nm from the interface between the InAlAs layer 12 and the n-InGaAs layer 11. When the high concentration region 14 is formed at a distance greater than 10 nm, it may become difficult for the tunneling current to flow, and when the distance is greater than 15 nm, the tunneling current may hardly flow. A tunnel effect is caused by electrons that leak based on a wave function. When the distance is greater than 10 nm, the probability that the above-mentioned leakage occurs may be significantly reduced, and the tunnel effect is less likely to occur.

It is not preferable for the high concentration region 14 to be formed relatively close to the interface between the InAlAs layer 12 and the n-InGaAs layer 11. Thus, the high concentration region 14 is preferably formed at a distance of 3 nm or more from the interface between the InAlAs layer 12 and the n-InGaAs layer 11. When the high concentration region 14 is formed too close to the interface between the InAlAs layer 12 and the n-InGaAs layer 11, forming a region in a conduction band of the n-InGaAs layer 11 in which the energy drops sharply, may become difficult.

The high concentration region 14 is preferably formed to be narrow, 2 nm or less, or more preferably, 1 nm or less. Also, the high concentration region 14 is preferably formed so that the impurity concentration of the high concentration region 14 is considerably higher than the impurity concentration of the n-InGaAs layer 11. Thus, by forming the high concentration region 14 at a narrow region in high concentration, the region in which the energy drops more sharply may be formed in the conduction band of the n-InGaAs layer 11, and the tunneling current may flow more easily without increasing the junction capacitance.

Therefore, the high concentration region 14 is formed so that the impurity concentration of the high concentration region 14 is higher than the impurity concentration of the n-InGaAs layer 11 of the backward diode. Furthermore, the high concentration region 14 is preferably formed so that the impurity concentration of the high concentration region 14 is twice, five times, or ten times or more than the impurity concentration of the n-InGaAs layer 11 to form the region in which the energy drops sharply in the conduction band of the n-InGaAs layer 11 and to make the tunneling current flow more easily without increasing the junction capacitance.

Figure 10:
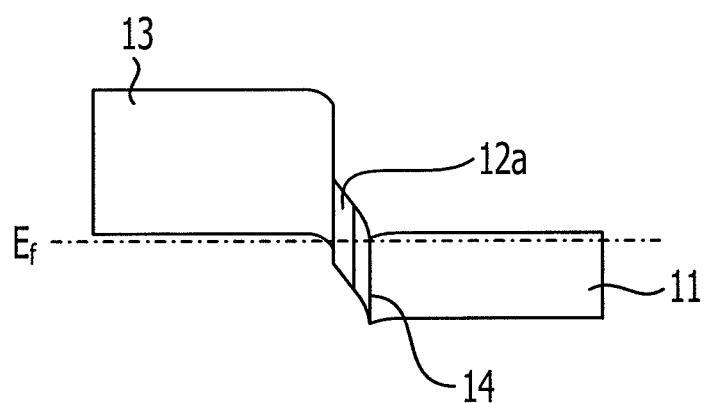
FIG. 10 is an energy band diagram of another backward diode according to the first embodiment.
Figure 11:
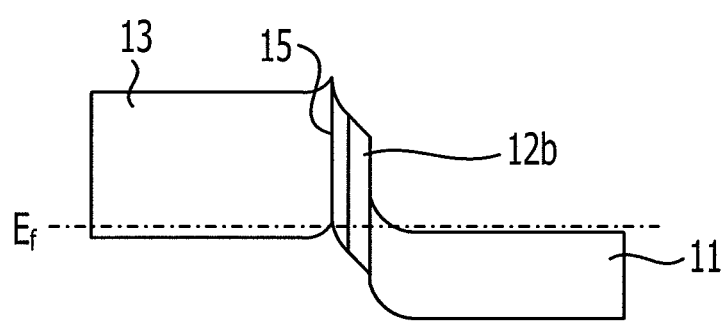
FIG. 11 is an energy band diagram of yet another backward diode according to the first embodiment.

With reference to FIGS. 9A and 9B, the InAlAs layer 12, which is the second semiconductor layer in which the band gap is larger than the band gap of the n-InGaAs layer 11 that is the first semiconductor layer, or the band gap of the p$^+$-GaAsSb layer 13 that is the third semiconductor layer has been described. As illustrated in FIG. 10, the second semiconductor layer may be formed with an InGaAs layer 12a that is non-doped, which is an intrinsic semiconductor of the first semiconductor layer. Also, as illustrated in FIG. 11, the second semiconductor layer may be formed with a GaAsSb layer 12b that is non-doped, which is an intrinsic semiconductor of the third semiconductor layer. In FIG. 11, a high concentration region 15 is formed by planar doping the p$^+$-GaAsSb layer 13 that is the third semiconductor layer with Zn.

The junction capacitance of the pn junction may be reduced, the cutoff frequency may be increased, and the detection sensitivity may be enhanced since the inter-band tunneling of electrons becomes relatively easier in the backward diode according to the first embodiment. Also, since the backward diode is formed over the InP substrate 10, crystal defects are less likely to arise and the backward diode may be integrated more easily with amplifiers such as high-performance high electron mobility transistors (HEMTs) or the like.

The second embodiment is described below. With reference to FIGS. 12A to 12D, a method of manufacturing a backward diode, which is a semiconductor device, is described.

Figure 12A:
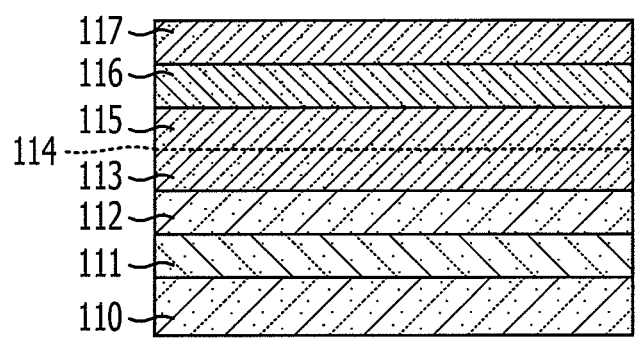
FIGS. 12A to 12D are sectional views of a backward diode according to the second embodiment.

As illustrated in FIG. 12A, semiconductor layers are stacked over a semi-insulating InP substrate 110 through epitaxial growth by metal organic chemical vapor deposition (MOCVD). Specifically, an i-InAlAs buffer layer 111, an n$^+$-InGaAs contact layer 112, an n-InGaAs first layer 113, a Si planar-doped layer 114, an n-InGaAs second layer 115, an i-InAlAs barrier layer 116, and a p$^+$-GaAsSb layer 117 are stacked over the InP substrate 110.

The i-InAlAs buffer layer 111 includes In$_{0.52}$Al$_{0.48}$As and the thickness of the i-InAlAs buffer layer 111 is approximately 300 nm.

The n$^+$-InGaAs contact layer 112 includes In$_{0.53}$Ga$_{0.47}$As and is doped with Si as an impurity element in a concentration of $1\times10^{19}$ cm$^{-3}$. The thickness of the n$^+$-InGaAs contact layer 112 is approximately 200 nm.

The n-InGaAs first layer 113 includes In$_{0.53}$Ga$_{0.47}$As and is doped with Si as the impurity element in a concentration of $5\times10^{17}$ cm$^{-3}$. The thickness of the n-InGaAs first layer 113 is approximately 50 nm.

A surface of the Si planar-doped layer 114 is doped with Si and the Si planar-doped layer 114 is formed by planar doping. The concentration of Si used in planar doping is $1\times10^{12}$ cm$^{-2}$. The impurity concentration of a high concentration region that is formed by planar doping is $5\times10^{18}$ cm$^{-3}$ or more and the thickness of the high concentration region is 2 nm or less or 1 nm or less depending on diffusion or the like.

The n-InGaAs second layer 115 includes In$_{0.53}$Ga$_{0.47}$As and is doped with Si as the impurity element in a concentration of $5\times10^{17}$ cm$^{-3}$. The thickness of the n-InGaAs second layer 115 is approximately 5 nm.

The i-InAlAs barrier layer 116 includes In$_{0.52}$Al$_{0.48}$As and the thickness of the i-InAlAs barrier layer 116 is approximately 3 nm. The band gap of the i-InAlAs barrier layer 116 is larger than the band gap of the n-InGaAs first layer 113, the n-InGaAs second layer 115, or the p$^+$-GaAsSb layer 117.

The p$^+$-GaAsSb layer 117 includes GaAs$_{0.51}$Sb$_{0.49}$ and is doped with Zn as the impurity element in a concentration of $2\times10^{19}$ cm$^{-3}$. The thickness of the p$^+$-GaAsSb layer 117 is approximately 50 nm.

The above-mentioned In$_{0.53}$Ga$_{0.47}$As, In$_{0.52}$Al$_{0.48}$As, and GaAs$_{0.51}$Sb$_{0.49}$ are compositions that are lattice-matched to InP.

Figure 12B:
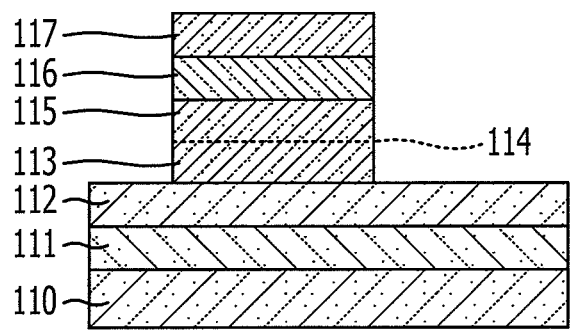

As illustrated in FIG. 12B, a portion of the n$^+$-InGaAs contact layer 112 is exposed by wet etching. Specifically, a resist pattern (not illustrated) is formed by applying photoresist to the p$^+$-GaAsSb layer 117 and conducting exposure and development with an exposure apparatus. Portions of the n-InGaAs first layer 113, the Si planar-doped layer 114, the n-InGaAs second layer 115, the i-InAlAs barrier layer 116, and the p$^+$-GaAsSb layer 117 in which the resist pattern is not formed, is removed by wet etching. The resist pattern (not illustrated) is removed with organic solvent or the like. For example, a liquid mixture of phosphoric acid and hydrogen peroxide solution is used as an etchant in wet etching. Thus, the n-InGaAs first layer 113, the Si planar-doped layer 114, the n-InGaAs second layer 115, the i-InAlAs barrier layer 116, and the p$^+$-GaAsSb layer 117 form a mesa shape. As a result, the portion of the n$^+$-InGaAs contact layer 112 may be exposed.

Figure 12C:
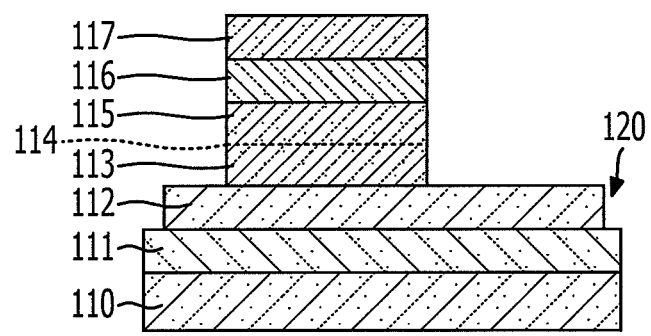

As illustrated in FIG. 12C, a device isolation region 120 is formed. Specifically, the resist pattern (not illustrated) that includes an opening in a region where the device isolation region 120 is to be formed, is formed by applying photoresist to the portion of the n$^+$-InGaAs contact layer 112 that is exposed and conducting exposure and development with the exposure apparatus. The portion of the n$^+$-InGaAs contact layer 112 in which the resist pattern is not formed is removed by wet etching. The resist pattern (not illustrated) is removed with organic solvent or the like. For example, the liquid mixture of phosphoric acid and hydrogen peroxide solution is used as the etchant in wet etching. As a result, the portion of the n$^+$-InGaAs contact layer 112 may be removed and the device isolation region 120 is formed.

Figure 12D:
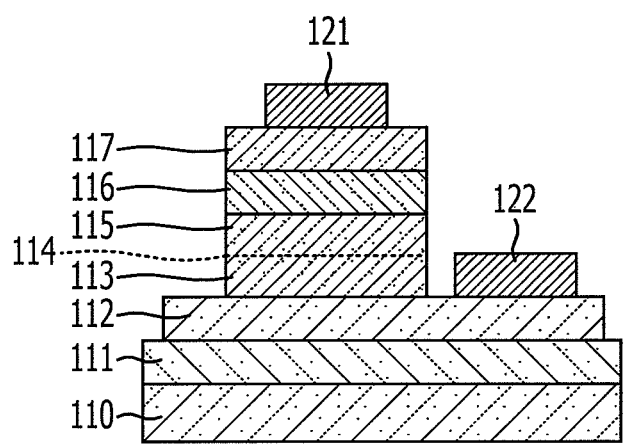

As illustrated in FIG. 12D, electrodes 121 and 122 are formed over the backward diode. Specifically, the resist pattern (not illustrated), which includes openings in the regions where the electrodes 121 and 122 are to be formed, is formed by applying photoresist to the portion of the n$^+$-InGaAs contact layer 112 that is exposed and conducting exposure and development with the exposure apparatus. A metal film in which 10 nm of Ti, 30 nm of Pt, and 300 nm of Au are stacked by vacuum evaporation, is formed. The metal film that is formed over the resist pattern (not illustrated) may be removed by, for example, immersing the metal film in organic solvent and by lift-off. By forming the metal film, the electrodes 121 and 122 that are in ohmic contact with the p$^+$-GaAsSb layer 117 and the n$^+$-InGaAs contact layer 112, respectively, are formed. The electrodes 121 and 122 are diode electrodes in the backward diode.

The n-InGaAs first layer 113 and the n-InGaAs second layer 115 in the second embodiment correspond to the n-InGaAs layer 11 in the first embodiment. The i-InAlAs barrier layer 116 in the second embodiment corresponds to the InAlAs layer 12 in the first embodiment. The p$^+$-GaAsSb layer 117 in the second embodiment corresponds to the p$^+$-GaAsSb layer 13 in the first embodiment. The high concentration region formed in the Si planar-doped layer 114 in the second embodiment corresponds to the high concentration region 14 in the first embodiment.

The third embodiment is described below. With reference to FIGS. 13A to 13F, a method of manufacturing a backward diode, which is a semiconductor device, is described.

Figure 13A:
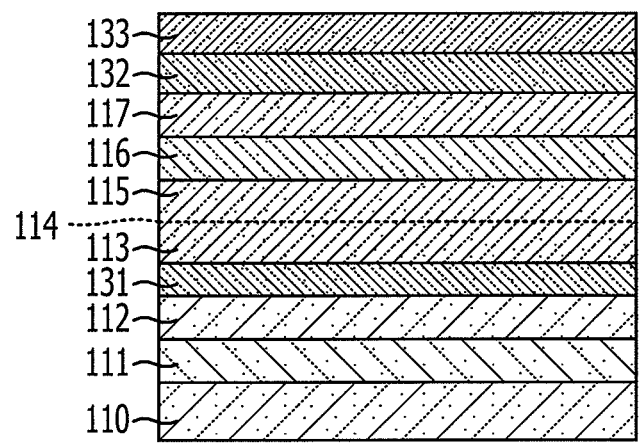
FIGS. 13A to 13F are sectional views of a backward diode according to the third embodiment.

As illustrated in FIG. 13A, semiconductor layers are stacked over a semi-insulating InP substrate 110 through epitaxial growth by metal organic chemical vapor deposition (MOCVD). Specifically, an i-InAlAs buffer layer 111, an n$^+$-InGaAs contact layer 112, an n-InP etching stopper layer 131, an n-InGaAs first layer 113, a Si planar-doped layer 114, an n-InGaAs second layer 115, an i-InAlAs barrier layer 116, a p$^+$-GaAsSb layer 117, an n-InGaAs layer 132, and an n$^+$-InGaAs contact layer 133 are stacked over the InP substrate 110.

The n-InP etching stopper layer 131 includes InP and is doped with Si as an impurity element in a concentration of $5 \times 10^{18}$ cm$^{-3}$. The thickness of the n-InP etching stopper layer 131 is approximately 5 nm.

The n-InGaAs layer 132 includes In$_{0.8}$Ga$_{0.2}$As and is doped with Si as the impurity element in a concentration of $5 \times 10^{18}$ cm$^{-3}$. The thickness of the n-InGaAs layer 132 is approximately 10 nm. The n-InGaAs layer 132 is in ohmic contact with the p$^+$-GaAsSb layer 117.

The n$^+$-InGaAs contact layer 133 includes In$_{0.53}$Ga$_{0.47}$As and is doped with Si as the impurity element in a concentration of $1 \times 10^{19}$ cm$^{-3}$. The thickness of the n$^+$-InGaAs contact layer 133 is approximately 100 nm.

Figure 13B:
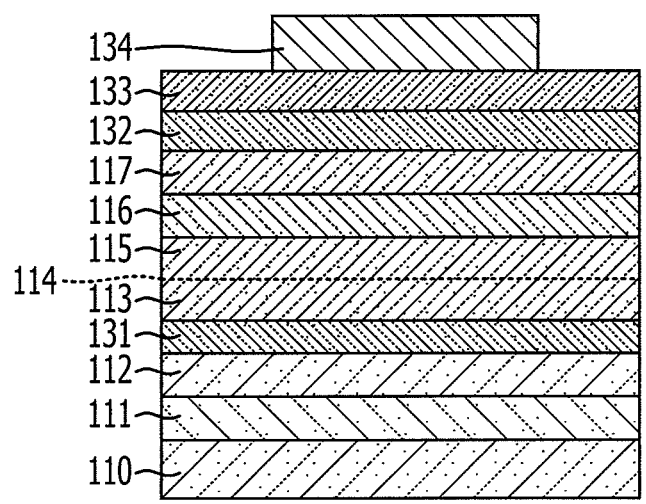

As illustrated in FIG. 13B, a WSi layer 134 is formed. Specifically, a WSi film is formed over the n$^+$-InGaAs contact layer 133 by sputtering, applying photoresist to the WSi film, and conducting exposure and development with an exposure apparatus. A resist pattern (not illustrated) is formed over a region where the WSi layer 134 is to be formed. A portion of the WSi film in which the resist pattern is not formed is removed by dry etching such as reactive ion etching (RIE), using, for example, CF$_4$ or SF$_6$ gas, and the WSi layer 134 is formed. The resist pattern (not illustrated) is removed with organic solvent or the like.

Figure 13C:
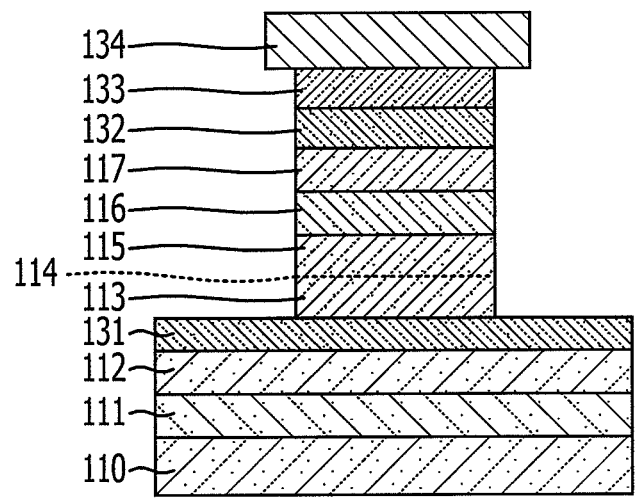

As illustrated in FIG. 13C, portions of semiconductor layers in which the WSi layer 134 is not formed is removed by wet etching and a portion of the n-InP etching stopper layer 131 is exposed. Specifically, wet etching is conducted by using the WSi layer 134 as a mask. Thus, portions of the n-InGaAs first layer 113, the Si planar-doped layer 114, the n-InGaAs second layer 115, the i-InAlAs barrier layer 116, the p$^+$-GaAsSb layer 117, the n-InGaAs layer 132, and the n$^+$-InGaAs contact layer 133 are removed. The n-InGaAs first layer 113, the Si planar-doped layer 114, the n-InGaAs second layer 115, the i-InAlAs barrier layer 116, the p$^+$-GaAsSb layer 117, the n-InGaAs layer 132, and the n$^+$-InGaAs contact layer 133 form a mesa shape. For example, a liquid mixture of phosphoric acid and hydrogen peroxide solution is used as an etchant in wet etching. The etching stops at the n-InP etching stopper layer 131 because InP is not etched by wet etching using the liquid mixture of phosphoric acid and hydrogen peroxide solution. The etched semiconductor layer may be further side-etched by over-etching for a given time. As a result, the side surfaces of the n-InGaAs first layer 113, the Si planar-doped layer 114, the n-InGaAs second layer 115, the i-InAlAs barrier layer 116, the p$^+$-GaAsSb layer 117, the n-InGaAs layer 132, and the n$^+$-InGaAs contact layer 133 may be etched.

Figure 13D:
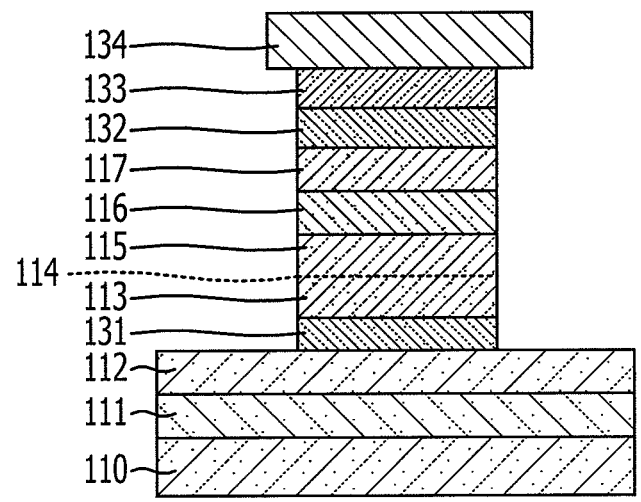

As illustrated in FIG. 13D, the portion of the n-InP etching stopper layer 131, which is exposed, that is, the portion of the n-InP etching stopper layer 131 in which the n-InGaAs first layer 113, the Si planar-doped layer 114, the n-InGaAs second layer 115, the i-InAlAs barrier layer 116, the p$^+$-GaAsSb layer 117, the n-InGaAs layer 132, and the n$^+$-InGaAs contact layer 133 have been removed, as illustrated in FIG. 13C, is removed by wet etching using hydrochloric acid. The etching stops at the n$^+$-InGaAs contact layer 112 because InGaAs is hardly etched in wet etching using hydrochloric acid.

Figure 13E:
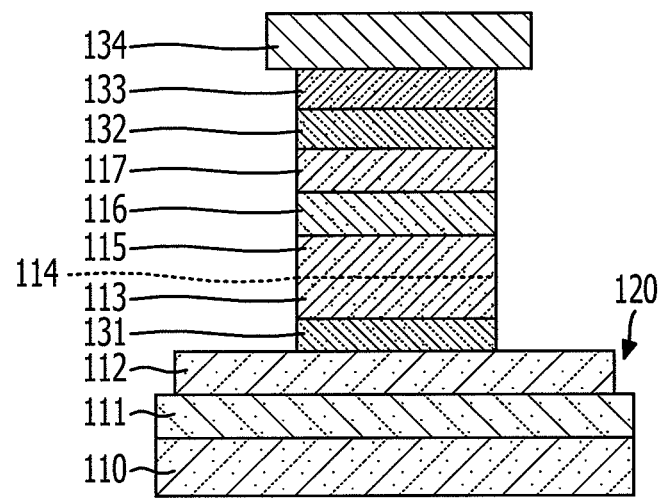

As illustrated in FIG. 13E, a device isolation region 120 is formed. Specifically, the resist pattern (not illustrated) that includes an opening in a region where the device isolation region 120 is to be formed, is formed, by applying photoresist to a portion of the n$^+$-InGaAs contact layer 112 that is exposed and conducting exposure and development with the exposure apparatus. The portion of the n$^+$-InGaAs contact layer 112 in which the resist pattern is not formed is removed by wet etching and the resist pattern (not illustrated) is removed with organic solvent or the like. For example, the liquid mixture of phosphoric acid and hydrogen peroxide solution is used as the etchant in wet etching. As a result, the portion of the n$^+$-InGaAs contact layer 112 is removed and the device isolation region 120 is formed.

Figure 13F:
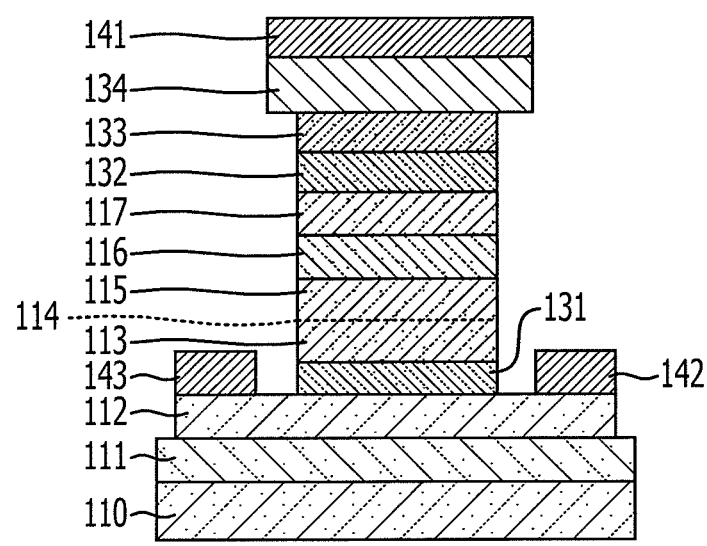

As illustrated in FIG. 13F, electrodes 141, 142, and 143 are formed. Specifically, the resist pattern (not illustrated) that include openings in the regions where the electrodes 141, 142, and 143 are to be formed, is formed, by applying photoresist to the portion of the n$^+$-InGaAs contact layer 112 that is exposed and conducting exposure and development with the exposure apparatus. The resist pattern is not formed in an area between the regions where the electrodes 141 and 142 are to be formed and an area between the regions where the electrodes 141 and 143 are to be formed because the electrodes 142 and 143 are self-aligned. A metal film in which 10 nm of Ti, 30 nm of Pt, and 300 nm of Au are stacked by vacuum evaporation, is formed. The metal film that is formed over the resist pattern (not illustrated) may be removed by, for example, immersing the metal film in organic solvent and by lift-off. The resistance component via the $n^+$-InGaAs contact layer 112 may be suppressed because the electrodes 142 and 143 are self-aligned to the WSi layer 134. That is, although lift-off is generally conducted to form the electrodes 142 and 143, aligning the electrodes 142 and 143 with high precision is considerably difficult. Thus, forming the electrodes 142 and 143 so that the electrodes 142 and 143 are positioned relatively far apart is desirable. However, by self-aligning the electrodes 142 and 143 to the WSi layer 134, the electrodes 142 and 143 may be formed at approximately precise locations at a given distance from the n-InP etching stopper layer 131. As a result, the resistance component via the $n^+$-InGaAs contact layer 112 may be controlled to be substantially constant, and the resistance component may be suppressed because positioning the electrodes 142 and 143 so that the electrodes 142 and 143 are relatively far apart is not necessary.

Descriptions of the elements in the third embodiment, which are substantially equivalent to the elements in the second embodiment, have been omitted.

The fourth embodiment is described below. With reference to FIGS. 14A to 14J, a method of manufacturing a backward diode, which is a semiconductor device, and a method of manufacturing a monolithic microwave integrated circuit (MMIC) in which a high electron mobility transistor (HEMT) is stacked, is described.

Figure 14A:
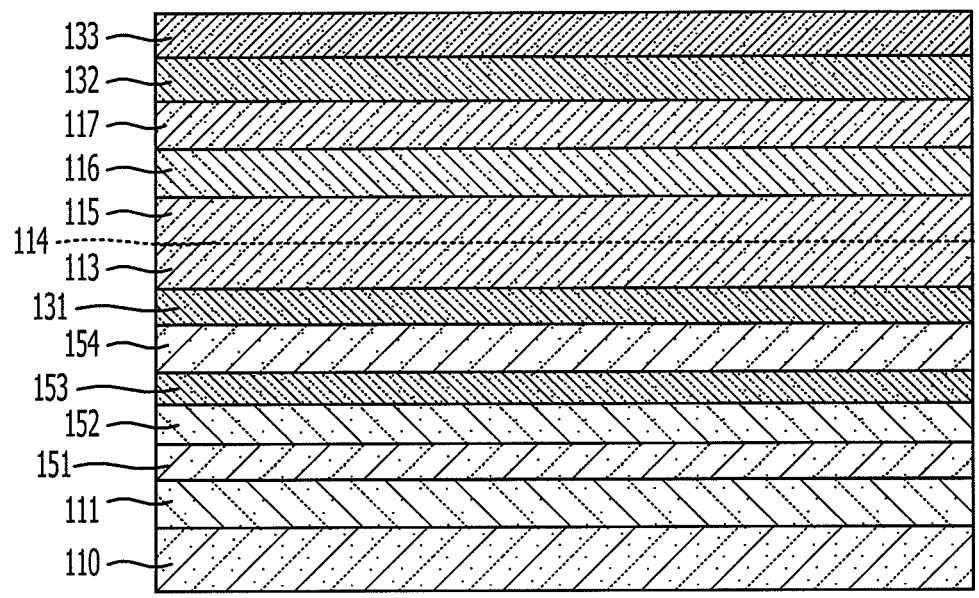

As illustrated in FIG. 14A, semiconductor layers are stacked over a semi-insulating InP substrate 110 through epitaxial growth by metal organic chemical vapor deposition (MOCVD). Specifically, an i-InAlAs buffer layer 111, an i-InGaAs channel layer 151, an n-InAlAs supply layer 152, an i-InP etching stopper layer 153, an $n^+$-InGaAs contact layer 154, an n-InP etching stopper layer 131, an n-InGaAs first layer 113, a Si planar-doped layer 114, an n-InGaAs second layer 115, an i-InAlAs barrier layer 116, a $p^+$-GaAsSb layer 117, an n-InGaAs layer 132, and an $n^+$-InGaAs contact layer 133 are stacked over the InP substrate 110.

The thickness of the i-InGaAs channel layer 151 is approximately 15 nm.

The n-InAlAs supply layer 152 is doped with an impurity element such as Si or the like that yield an n-type property and the thickness of the n-InAlAs supply layer 152 is approximately 8 nm.

The n-InP etching stopper layer 131 is doped with the impurity element such as Si or the like that yield the n-type property and the thickness of the n-InP etching stopper layer 131 is approximately 5 nm.

The $n^+$-InGaAs contact layer 154 is doped with Si as the impurity element in a concentration of $1 \times 10^{19}$ $cm^{-3}$ and the thickness of the $n^+$-InGaAs contact layer 154 is approximately 50 nm.

The i-InGaAs channel layer 151, the n-InAlAs supply layer 152, the i-InP etching stopper layer 153, and the $n^+$-InGaAs contact layer 154 that are stacked over the InP substrate 110 form the HEMT. The n-InGaAs first layer 113, the Si planar-doped layer 114, the n-InGaAs second layer 115, the i-InAlAs barrier layer 116, and the $p^+$-GaAsSb layer 117 form the backward diode.

Figure 14B:
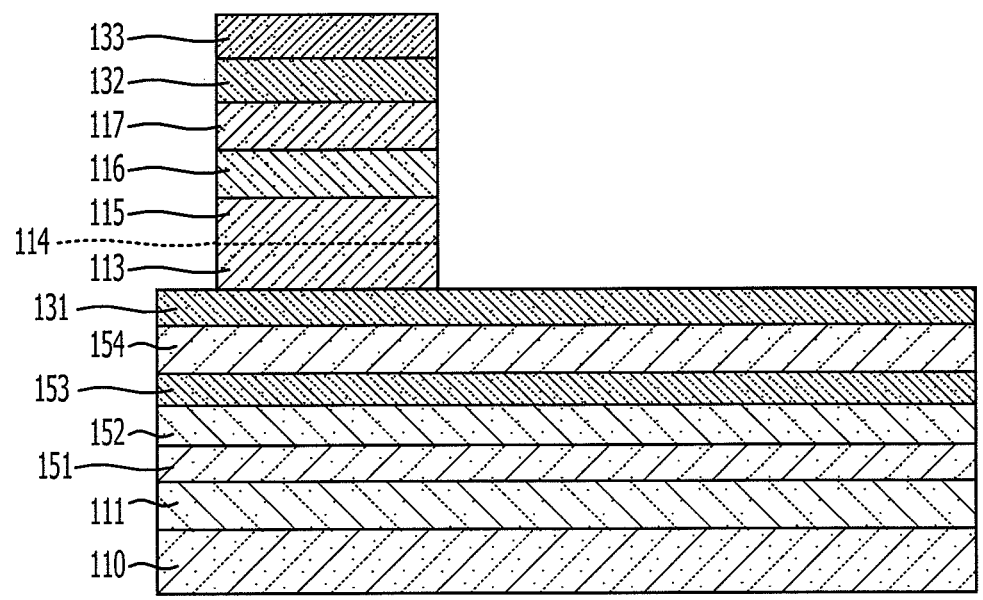

As illustrated in FIG. 14B, wet etching is conducted until the n-InP etching stopper layer 131 is exposed. Specifically, a resist pattern (not illustrated) is formed by applying photoresist to the $n^+$-InGaAs contact layer 133 and conducting exposure and development with an exposure apparatus. Wet etching is conducted by using the resist pattern as a mask. Thus, portions of the n-InGaAs first layer 113, the Si planar-doped layer 114, the n-InGaAs second layer 115, the i-InAlAs barrier layer 116, the $p^+$-GaAsSb layer 117, the n-InGaAs layer 132, and the $n^+$-InGaAs contact layer 133 are removed. For example, a liquid mixture of phosphoric acid and hydrogen peroxide solution is used as an etchant in wet etching. The etching stops at the n-InP etching stopper layer 131 because InP is not etched by the etchant. Thus, the n-InGaAs first layer 113, the Si planar-doped layer 114, the n-InGaAs second layer 115, the i-InAlAs barrier layer 116, the $p^+$-GaAsSb layer 117, the n-InGaAs layer 132, and the $n^+$-InGaAs contact layer 133 form a mesa shape.

Figure 14C:
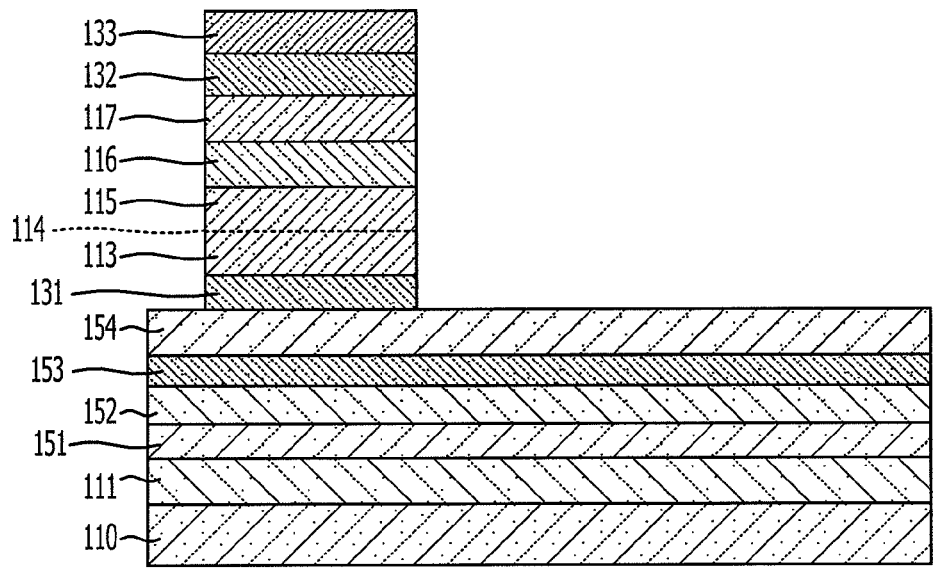

As illustrated in FIG. 14C, the n-InP etching stopper layer 131 that is exposed, that is, the n-InP etching stopper layer 131 where the n-InGaAs first layer 113, the Si planar-doped layer 114, the n-InGaAs second layer 115, the i-InAlAs barrier layer 116, the $p^+$-GaAsSb layer 117, the n-InGaAs layer 132, and the $n^+$-InGaAs contact layer 133 have been removed as illustrated in FIG. 14B, is removed by wet etching using hydrochloric acid. The etching stops at the $n^+$-InGaAs contact layer 154 because InGaAs is hardly etched by wet etching using hydrochloric acid.

Figure 14D:
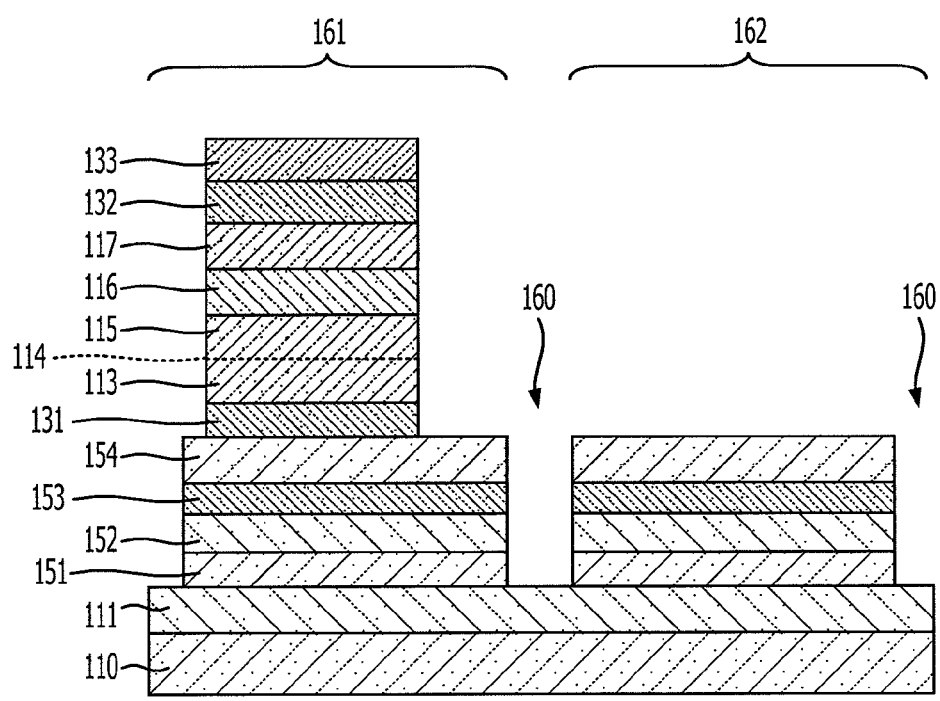

As illustrated in FIG. 14D, a device isolation region 160 is formed. Specifically, the resist pattern (not illustrated), which includes an opening in a region where the device isolation region 160 is to be formed, is formed by applying photoresist to a portion of the $n^+$-InGaAs contact layer 154 that is exposed and conducting exposure and development with the exposure apparatus. Portions of the i-InGaAs channel layer 151, the n-InAlAs supply layer 152, the i-InP etching stopper layer 153, and the $n^+$-InGaAs contact layer 154 in which the resist pattern is not formed, are removed by wet etching. The resist pattern is removed by organic solvent or the like. For example, the liquid mixture of phosphoric acid and hydrogen peroxide solution is used as the etchant in wet etching of the i-InGaAs channel layer 151, the n-InAlAs supply layer 152, and the $n^+$-InGaAs contact layer 154. For example, a liquid mixture of hydrochloric acid and phosphoric acid is used in etching the i-InP etching stopper layer 153. As a result, the device isolation region 160 may be formed, and device isolation in the backward diode and the HEMT may be conducted at the same time. The resist pattern (not illustrated) is removed. Thus, a backward diode region 161 and a HEMT region 162 are formed by forming the device isolation region 160.

Figure 14E:
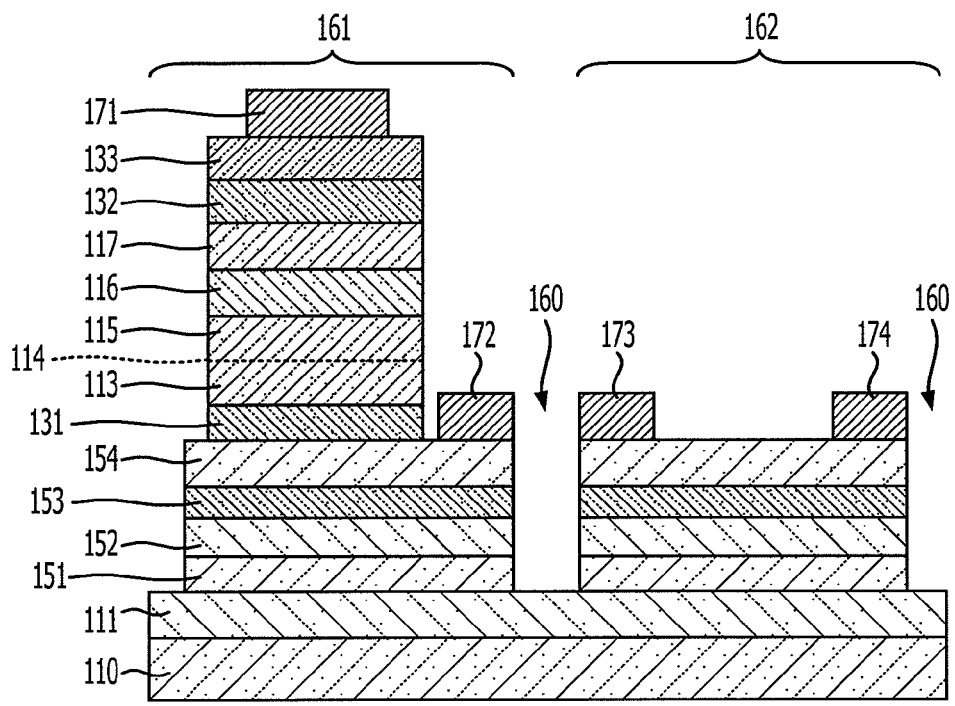

As illustrated in FIG. 14E, diode electrodes 171 and 172 of the backward diode, and a source electrode 173 and a drain electrode 174 of the HEMT are formed. Specifically, the resist pattern (not illustrated) is formed by applying photoresist to the portion of the $n^+$-InGaAs contact layer 154 that is exposed and conducting exposure and development with the exposure apparatus. The resist pattern includes openings in the regions where the diode electrodes 171 and 172 of the backward diode, and the source electrode 173 and the drain electrode 174 of the HEMT are to be formed. A metal film in which 10 nm of Ti, 30 nm of Pt, and 300 nm of Au are stacked by vacuum evaporation, is formed. The metal film that is formed over the resist pattern (not illustrated) may be removed by, for example, immersing the metal film in organic solvent and by lift-off. Thus, the diode electrodes 171 and 172 of the backward diode, and the source electrode 173 and the drain electrode 174 of the HEMT may be formed at the same time.

Figure 14F:
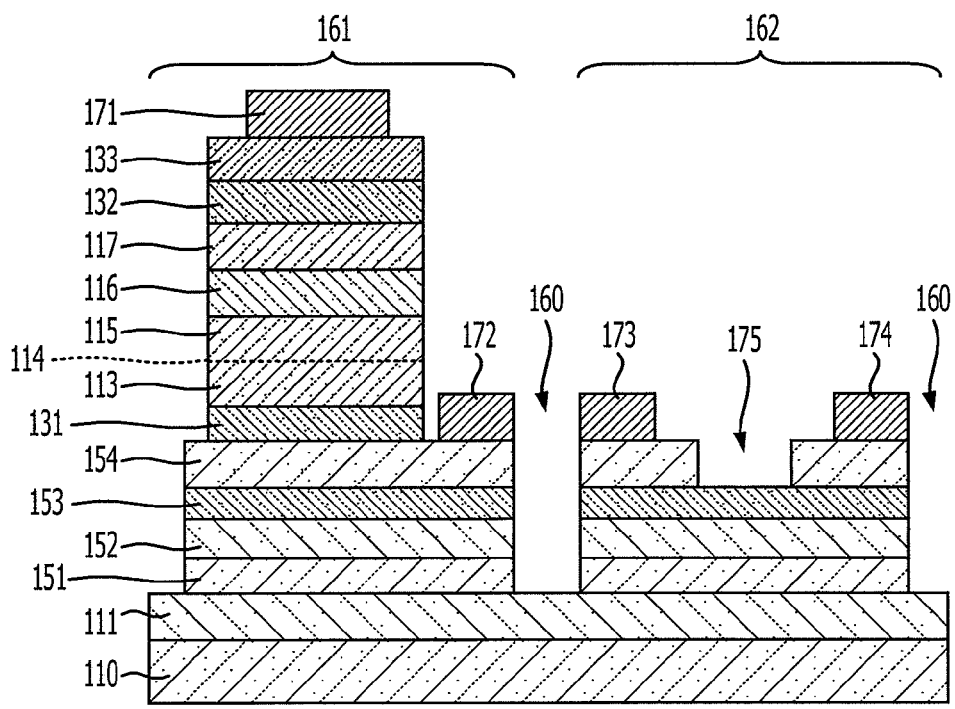

As illustrated in FIG. 14F, a recess portion 175 is formed by removing a portion of the n⁺-InGaAs contact layer 154 in the HEMT region 162. Specifically, the resist pattern (not illustrated) that includes an opening in a region where the recess portion 175 is to be formed, is formed by applying electron beam resist over the portion of the n⁺-InGaAs contact layer 154 that is exposed, by using an electron beam exposure apparatus such as an electron beam drawing apparatus. The portion of the n⁺-InGaAs contact layer 154 in which the resist pattern is not formed is removed by wet etching using an etchant that includes a liquid mixture of citric acid and hydrogen peroxide solution. The etching stops at the i-InP etching stopper layer 153 because InP is not etched by the etchant. The resist pattern is removed with organic solvent or the like.

Figure 14G:
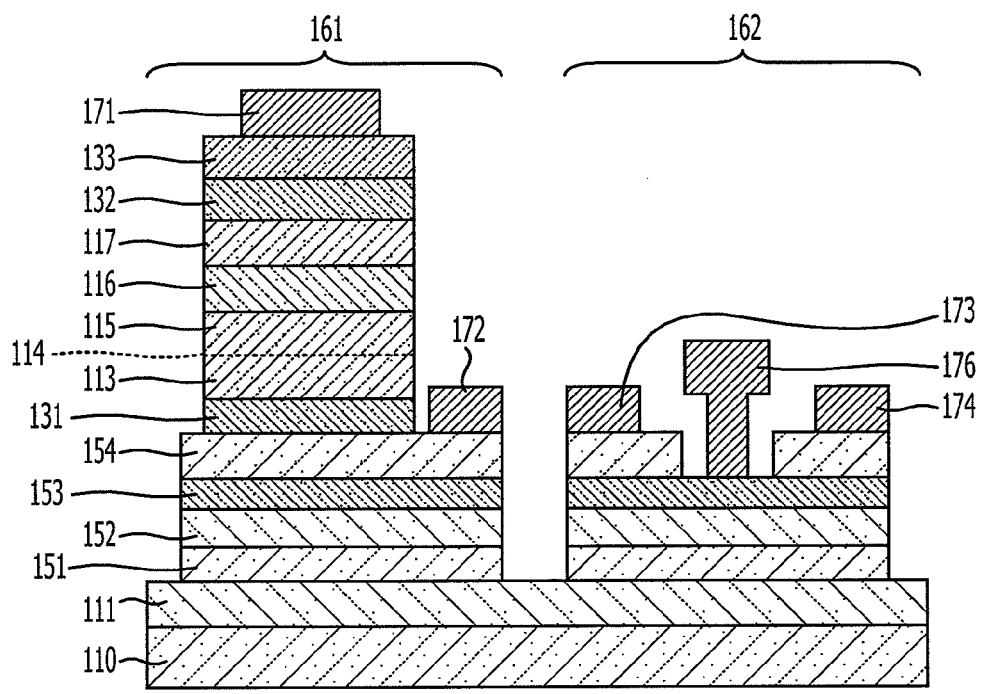

As illustrated in FIG. 14G, a gate electrode 176 is formed in the recess portion 175 in the HEMT region 162. Specifically, the resist pattern (not illustrated) that includes an opening in a region where the gate electrode 176 is to be formed, is formed by applying electron beam resist to the recess portion 175 and using the electron beam exposure apparatus such as the electron beam drawing apparatus. A metal film in which 10 nm of Ti, 30 nm of Pt, and 500 nm of Au are stacked by vacuum evaporation, is formed. The metal film that is formed over the resist pattern (not illustrated) may be removed by, for example, immersing the metal film in organic solvent and by lift-off. Thus, the gate electrode 176 is formed in the HEMT.

Figure 14H:
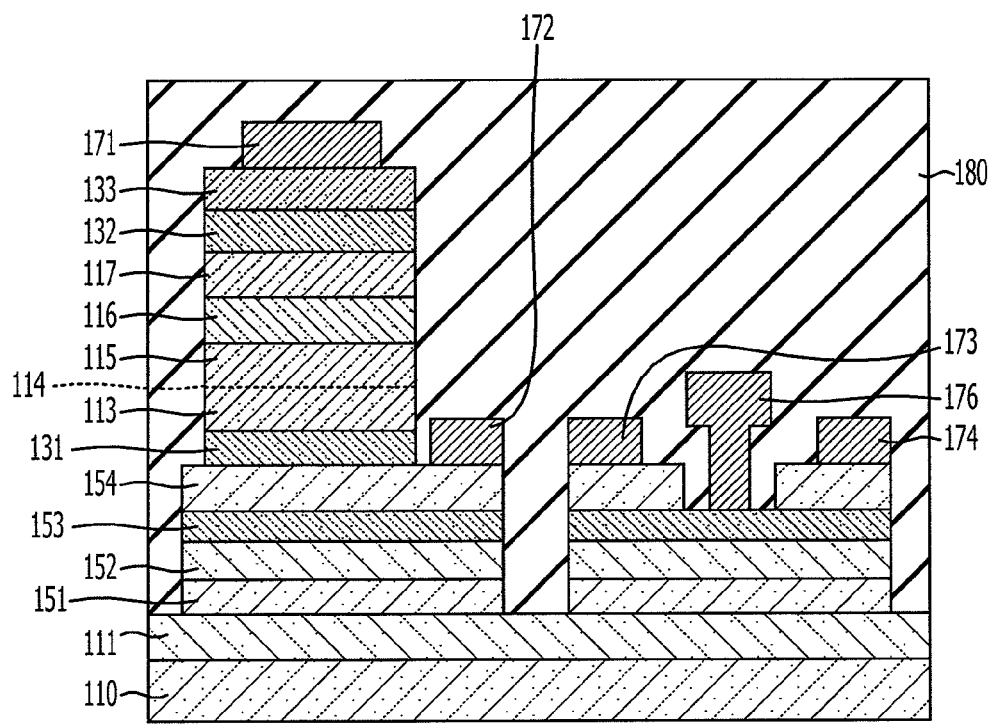

As illustrated in FIG. 14H, an interlayer insulating film 180 is formed over the diode electrodes 171 and 172 of the backward diode, and the source electrode 173 and the drain electrode 174 of the HEMT. The interlayer insulating film 180 includes benzocyclobutene (BCB) or polyimide.

Figure 14I:
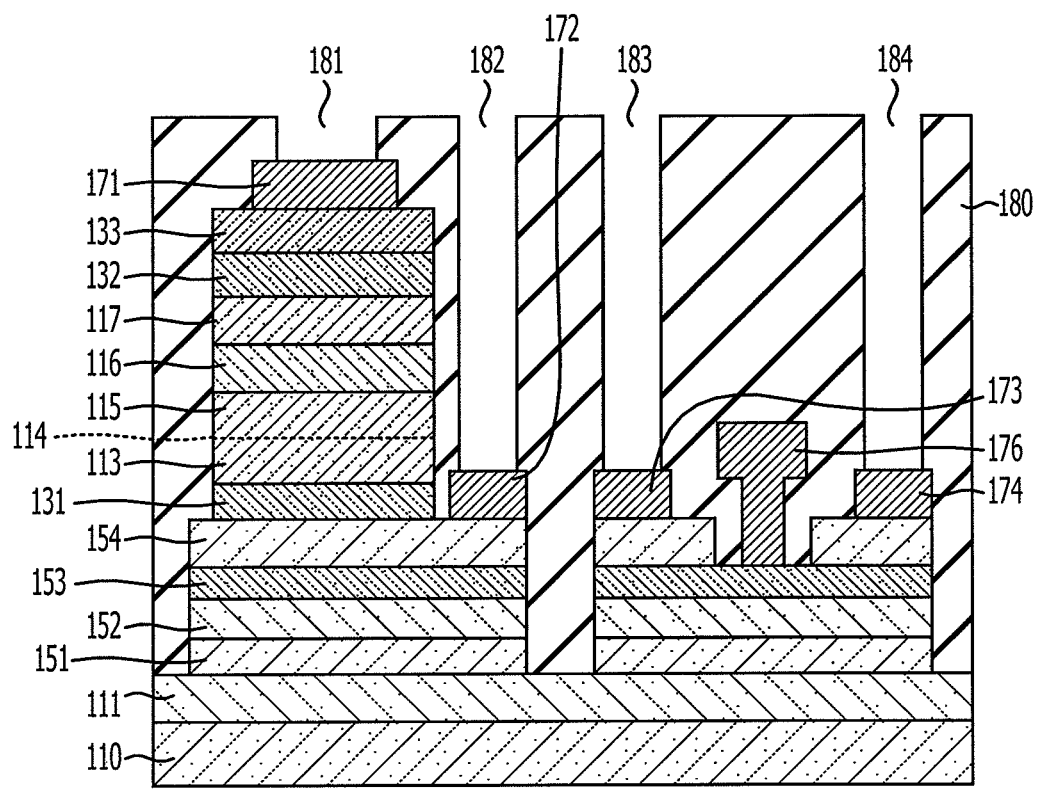

As illustrated in FIG. 14I, portions of the interlayer insulating film 180 over the diode electrodes 171 and 172 of the backward diode, and the source electrode 173 and the drain electrode 174 of the HEMT are removed. As a result, contact holes 181, 182, 183, and 184 are formed. Specifically, the resist pattern (not illustrated) that includes openings in the regions where the contact holes 181, 182, 183, and 184 are to be formed, is formed by applying photoresist to the interlayer insulating film 180 and conducting exposure and development with the exposure apparatus. Dry etching is conducted until the diode electrodes 171 and 172 of the backward diode, and the source electrode 173 and the drain electrode 174 of the HEMT are exposed. As a result, the contact holes 181, 182, 183, and 184 are formed.

Figure 14J:
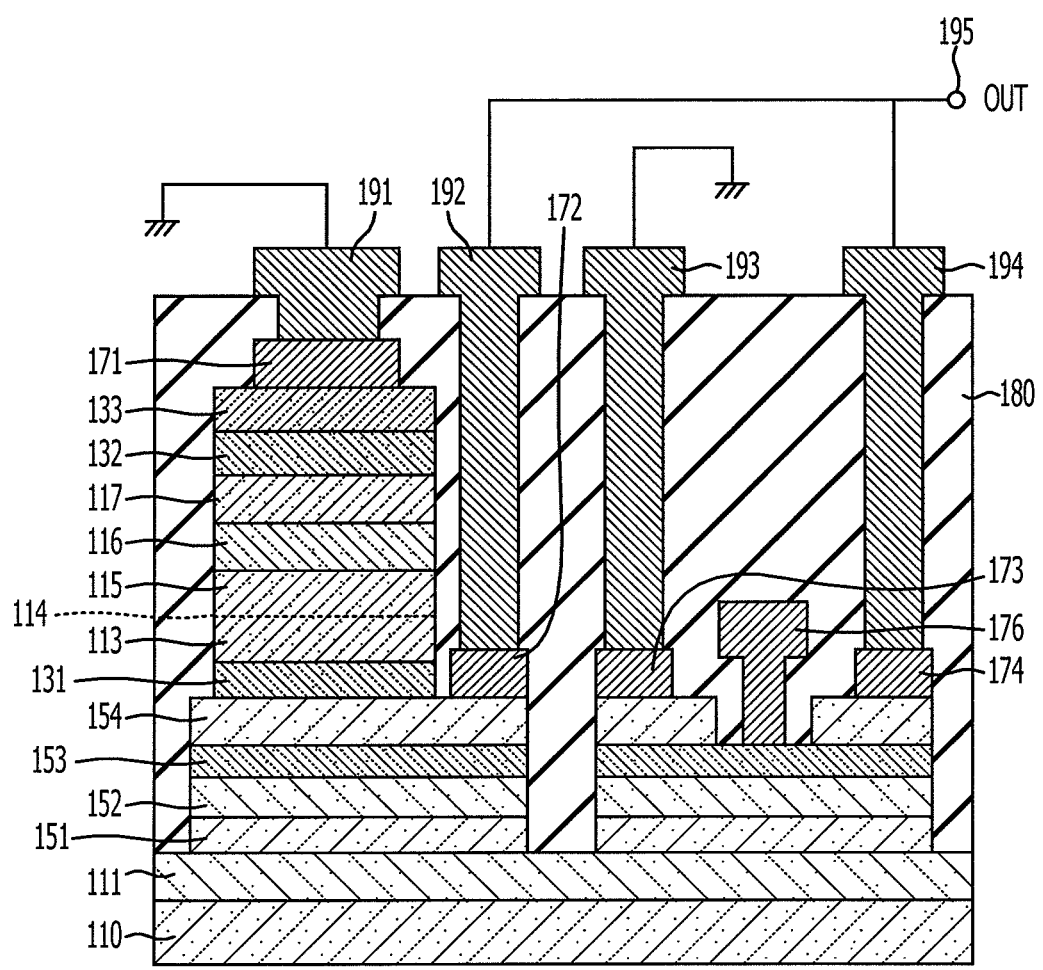

As illustrated in FIG. 14J, wire electrodes 191, 192, 193, and 194 that include plating such as Au or the like are formed in the contact holes 181, 182, 183, and 184, respectively. Specifically, the wire electrodes 191, 192, 193, and 194 are electrically coupled to the diode electrodes 171 and 172 of the backward diode, and the source electrode 173 and the drain electrode 174 of the HEMT, respectively. The wire electrode 191 coupled to the diode electrode 171, and the wire electrode 193 coupled to the source electrode 173 are grounded. The wire electrode 192 coupled to the diode electrode 172, and the wire electrode 194 coupled to the drain electrode 174, are coupled to each other, and are coupled to an output terminal 195.

Descriptions of the elements in the fourth embodiment, which are substantially equivalent to the elements in the second and third embodiments, have been omitted.

Figure 15:
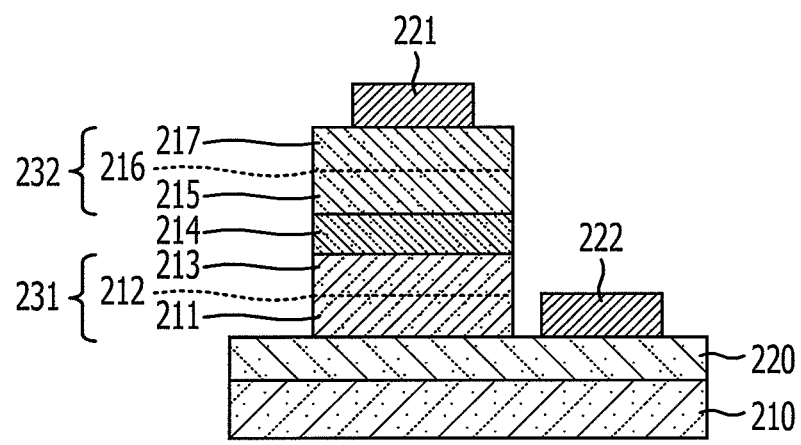
FIG. 15 is a sectional view of a backward diode according to the fifth embodiment.

The fifth embodiment is described below. The structure of a backward diode in the fifth embodiment, which is a semiconductor device, is different from the structure of the backward diode in the first embodiment. FIG. 15 illustrates the structure of the backward diode in the fifth embodiment. A high concentration region is provided over an n-InGaAs region and a p-GaAsSb region of the backward diode.

An n-InGaAs first layer 211, a Si planar-doped layer 212, an n-InGaAs second layer 213, an i-InAlAs layer 214, a p-GaAsSb first layer 215, a Zn planar-doped layer 216, and a p-GaAsSb second layer 217 are stacked over an InP substrate 210 via a buffer layer (not illustrated) and an n⁺-InGaAs contact layer 220 in the backward diode. An n-InGaAs region 231 includes the n-InGaAs first layer 211, the Si planar-doped layer 212, and the n-InGaAs second layer 213. A p-GaAsSb region 232 includes the p-GaAsSb first layer 215, the Zn planar-doped layer 216, and the p-GaAsSb second layer 217. The high concentration region in the n-InGaAs region 231 is formed with the Si planar-doped layer 212, and the high concentration region in the p-GaAsSb region 232 is formed with the Zn planar-doped layer 216. The n⁺-InGaAs contact layer 220 is doped with impurities in high concentration and is conductive. An electrode 221, which is a diode electrode, is formed over the p-GaAsSb second layer 217, and an electrode 222, which is another diode electrode, is formed over the n⁺-InGaAs contact layer 220.

Figure 16:
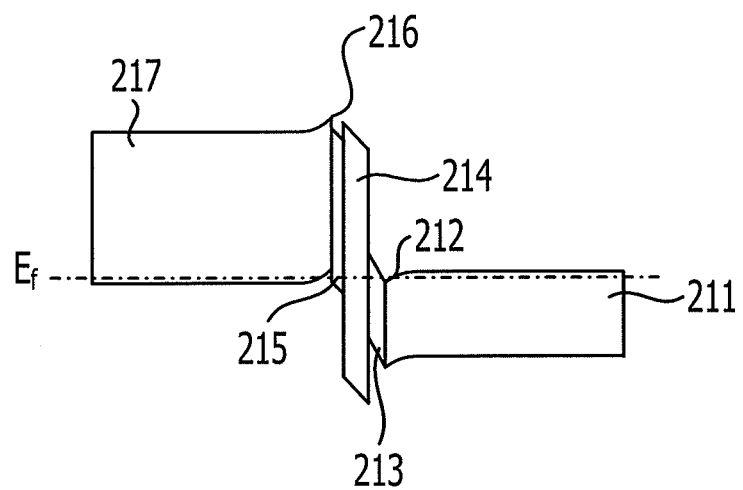
FIG. 16 is an energy band diagram of the backward diode according to the fifth embodiment.

FIG. 16 is an energy band diagram of the backward diode. The n-InGaAs first layer 211, the Si planar-doped layer 212, the n-InGaAs second layer 213, the i-InAlAs layer 214, the p-GaAsSb first layer 215, the Zn planar-doped layer 216, and the p-GaAsSb second layer 217 are stacked.

The n-InGaAs first layer 211 and the n-InGaAs second layer 213 are doped with Si as an impurity element in low concentration, for example, $5 \times 10^{17}$ cm$^{-3}$. The thickness of the n-InGaAs first layer 211 is approximately 50 nm and the thickness of the n-InGaAs second layer 213 is approximately 5 nm.

A surface of the Si planar-doped layer 212 is doped with Si and the Si planar-doped layer 212 is formed by planar doping. The concentration of Si used in planar doping is $1 \times 10^{12}$ cm$^{-2}$. The impurity concentration of the high concentration region that is formed by planar doping is $5 \times 10^{18}$ cm$^{-3}$ or more and the thickness of the high concentration region is 2 nm or less or 1 nm or less depending on diffusion or the like.

The thickness of the i-InAlAs layer 214 is approximately 3 nm. The band gap of the i-InAlAs layer 214 is larger than the band gap of the n-InGaAs first layer 211, the n-InGaAs second layer 213, the p-GaAsSb first layer 215, or the p-GaAsSb second layer 217.

The p-GaAsSb first layer 215 and the p-GaAsSb second layer 217 are doped with Zn as the impurity element in low concentration, for example, $1 \times 10^{18}$ cm$^{-3}$. The thickness of the p-GaAsSb first layer 215 is approximately 5 nm and the thickness of the p-GaAsSb second layer 217 is approximately 50 nm.

A surface of the Zn planar-doped layer 216 is doped with Zn and the Zn planar-doped layer 216 is formed by planar doping. The concentration of Zn used in planar doping is $1 \times 10^{12}$ cm$^{-2}$. The impurity concentration of the high concentration region that is formed by planar doping is $5 \times 10^{18}$ cm$^{-3}$ or more and the thickness of the high concentration region is 2 nm or less or 1 nm or less depending on diffusion or the like.

The high concentration regions are formed on both sides of the i-InAlAs layer 214 in the backward diode. By forming the high concentration regions on both sides of the i-InAlAs layer 214, the junction capacitance may be decreased further compared to when the high concentration region is formed on one side.

Descriptions of the elements in the fifth embodiment, which are substantially equivalent to the elements in the first embodiment, have been omitted.

Although the embodiments of the present invention are numbered with, for example, "first," "second," "third," "fourth," or "fifth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A semiconductor device, comprising:
    a first semiconductor layer of a first conductivity type, the first semiconductor layer being doped with impurity elements;
    a second semiconductor layer formed in contact with the first semiconductor layer;
    a third semiconductor layer of a second conductivity type formed in contact with the second semiconductor layer, and
    a first planar-doped layer formed in the first semiconductor layer at a given distance from an interface between the first semiconductor layer and the second semiconductor layer, the first planar-doped layer being planar-doped with Si as a impurity element, and an impurity concentration of the first planar-doped layer is higher than an impurity concentration of the first semiconductor layer except where the first planar-doped layer is formed.

2. The semiconductor device according to claim 1, wherein a second planar-doped layer is formed in the third semiconductor layer at a given distance from an interface between the third semiconductor layer and the second semiconductor layer, and
an impurity concentration of the second planar-doped layer is higher than an impurity concentration of the third semiconductor layer except where the second planar-doped layer is formed.

3. The semiconductor device according to claim 1, wherein the given distance is 3 nm or more and 15 nm or less.

4. The semiconductor device according to claim 1, wherein the first semiconductor layer, the second semiconductor layer, and the third semiconductor layer are formed lattice-matched to InP.

5. The semiconductor device according to claim 1, wherein the first conductivity type is an n-type and the second conductivity type is a p-type.

6. The semiconductor device according to claim 1, wherein the first semiconductor layer includes InGaAs.

7. The semiconductor device according to claim 1, wherein the third semiconductor layer includes GaAsSb.

8. The semiconductor device according to claim 1, wherein the first semiconductor region is formed by planar doping an impurity element.

9. The semiconductor device according to claim 1, wherein the first semiconductor layer, the second semiconductor layer, and the third semiconductor layer are formed over a semiconductor substrate, and a high electron mobility transistor (HEMT) is formed over the semiconductor substrate.

10. The semiconductor device according to claim 9, wherein the HEMT includes a fourth semiconductor layer formed over the semiconductor substrate, a fifth semiconductor layer of the first conductivity type formed over the fourth semiconductor layer, and the first semiconductor layer, the second semiconductor layer, and the third semiconductor layer formed over the fifth semiconductor layer.

11. The semiconductor device according to claim 10, wherein the fourth semiconductor layer includes InGaAs.

12. The semiconductor device according to claim 10, wherein the fifth semiconductor layer includes InAlAs.

* * * * *